United States Patent
Karhade et al.

(10) Patent No.: US 9,397,071 B2
(45) Date of Patent: Jul. 19, 2016

(54) HIGH DENSITY INTERCONNECTION OF MICROELECTRONIC DEVICES

(71) Applicant: Intel Corporation, Santa Clara, CA (US)

(72) Inventors: Omkar G. Karhade, Chandler, AZ (US); John S. Guzek, Chandler, AZ (US); Johanna M. Swan, Scottsdale, AZ (US); Christopher J. Nelson, Gilbert, AZ (US); Nitin A. Deshpande, Chandler, AZ (US); William J. Lambert, Chandler, AZ (US); Charles A. Gealer, Phoenix, AZ (US); Feras Eid, Chandler, AZ (US); Islam A. Salama, Chandler, AZ (US); Kemal Aygun, Chandler, AZ (US); Sasha N. Oster, Chandler, AZ (US); Tyler N. Osborn, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 14/102,757

(22) Filed: Dec. 11, 2013

(65) Prior Publication Data
US 2015/0163904 A1     Jun. 11, 2015

(51) Int. Cl.
*H05K 7/00* (2006.01)
*H01L 25/00* (2006.01)
(Continued)

(52) U.S. Cl.
CPC ............ *H01L 25/00* (2013.01); *H01L 23/5383* (2013.01); *H01L 23/5386* (2013.01); *H01L 23/5387* (2013.01); *H01L 24/50* (2013.01); *H01L 24/86* (2013.01);
(Continued)

(58) Field of Classification Search
CPC . H01L 25/00; H01L 25/0655; H01L 23/4985; H01L 24/50; H01L 24/86; H01L 2224/05647; H01L 2224/86203; H01L 2224/056; H01L 2224/86815; H01L 2224/05568; H01L 2224/04105; H01L 2224/0405; H05K 1/185; Y10T 29/49155
USPC ...................................... 361/679.02, 748–803
See application file for complete search history.

(56) References Cited

U.S. PATENT DOCUMENTS

| | | | | |
|---|---|---|---|---|
| 2004/0113261 A1* | 6/2004 | Sunohara | .......... | H01L 21/76898 257/700 |
| 2008/0050901 A1* | 2/2008 | Kweon | ............... | H01L 21/4853 438/597 |
| 2009/0244874 A1* | 10/2009 | Mahajan | ................. | H01L 24/16 361/809 |

(Continued)

*Primary Examiner* — Anthony Haughton
*Assistant Examiner* — Yahya Ahmad
(74) *Attorney, Agent, or Firm* — Winkle, PLLC

(57) ABSTRACT

A microelectronic package of the present description may comprises a first microelectronic device having at least one row of connection structures electrically connected thereto and a second microelectronic device having at least one row of connection structures electrically connected thereto, wherein the connection structures within the at least one first microelectronic device row are aligned with corresponding connection structures within the at least one second microelectronic device row in an x-direction. An interconnect comprising an interconnect substrate having a plurality of electrically isolated conductive traces extending in the x-direction on a first surface of the interconnect substrate may be attached to the at least one first microelectronic device connection structure row and the at least one second microelectronic device connection structure row, such that at least one interconnect conductive trace forms a connection between a first microelectronic device connection structure and its corresponding second microelectronic device connection structure.

12 Claims, 7 Drawing Sheets

(51) Int. Cl.
*H01L 23/00* (2006.01)
*H01L 25/065* (2006.01)
*H01L 23/538* (2006.01)
*H05K 1/18* (2006.01)

(52) U.S. Cl.
CPC .... *H01L 25/0655* (2013.01); *H01L 2224/0405* (2013.01); *H01L 2224/04105* (2013.01); *H01L 2224/056* (2013.01); *H01L 2224/05568* (2013.01); *H01L 2224/05647* (2013.01); *H01L 2224/86203* (2013.01); *H01L 2224/86815* (2013.01); *H05K 1/185* (2013.01); *Y10T 29/49155* (2015.01)

(56) References Cited

U.S. PATENT DOCUMENTS

| | | | |
|---|---|---|---|
| 2011/0241215 A1* | 10/2011 | Sankman | H01L 21/6835 257/773 |
| 2012/0074581 A1* | 3/2012 | Guzek | H01L 23/481 257/774 |
| 2012/0153435 A1* | 6/2012 | Haba | H01L 23/13 257/532 |
| 2014/0273346 A1* | 9/2014 | Crisp | H01L 25/50 438/107 |
| 2015/0115454 A1* | 4/2015 | Magnus | H01L 21/76895 257/773 |

* cited by examiner

HIGH DENSITY INTERCONNECTION OF MICROELECTRONIC DEVICES

TECHNICAL FIELD

Embodiments of the present description generally relate to the field of microelectronic packaging, and, more particularly, to the interconnection of microelectronic devices, such as interconnecting microelectronic dice within a microelectronic package and/or interconnecting microelectronic packages.

BACKGROUND

The microelectronic industry is continually striving to produce ever faster and smaller microelectronic devices for use in various mobile electronic products, such as portable computers, electronic tablets, cellular phones, digital cameras, and the like. As these goals are achieved, the packaging of the microelectronic devices becomes more challenging. One such challenging area relates to the interconnection of microelectronic devices within a microelectronic package. As microelectronic packages become smaller and smaller, the available space for routing traces for input/output interconnections between microelectronic devices within the microelectronic packages decreases, which can result in having to direct the routing traces through relatively long paths. Such long paths can result increasing resistance, which can reduce the performance of the resulting microelectronic packages.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
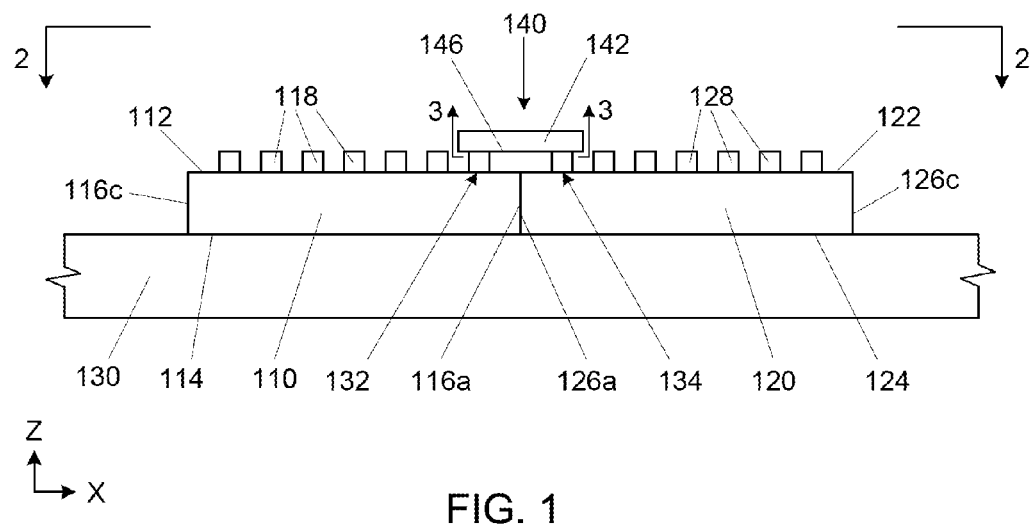
FIG. 1 illustrates a side cross-sectional view of a first microelectronic device and a second microelectronic device connected with an interconnect, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic package comprising a first microelectronic device having at least one row of connection structures electrically connected thereto and a second microelectronic device having at least one row of connection structures electrically connected thereto, wherein the connection structures within the at least one first microelectronic device row are aligned with corresponding connection structures within the at least one second microelectronic device row in an x-direction. An interconnect comprising an interconnect substrate having a plurality of electrically isolated conductive traces extending in the x-direction on a first surface of the interconnect substrate may be attached to at least one first microelectronic device connection structure in the at least one first microelectronic device connection structure row and at least one second microelectronic device connection structure in the at least one second microelectronic device connection structure row, such that at least one interconnect conductive trace forms a connection between a first microelectronic device connection structure and its corresponding second microelectronic device connection structure. In one embodiment, the first microelectronic device connection structures may be formed adjacent the first microelectronic device and the second microelectronic device connection structures may be formed adjacent the second microelectronic device. In another embodiment, a connection trace network may be formed adjacent the first microelectronic device and the second microelectronic device, wherein the at least one first microelectronic interconnect structure row and the at least one second microelectronic device interconnect structure row may be formed in or on a connection trace network.

As shown in FIG. 1, a first microelectronic device 110 may be formed having an active surface 112 and an opposing back surface 114 with at the least one side (illustrated as a first side 116a (shown in FIGS. 1 and 2), a second side 116b (shown in FIG. 2), a third side 116c (shown in FIGS. 1 and 2), and a fourth side 116d (shown in FIG. 2)) extending from the active surface 112 to the opposing back surface 114. Further, a second microelectronic device 120 may be formed having an active surface 122 and an opposing back surface 124 with at the least one side (illustrated as a first side 126a (shown in FIGS. 1 and 2), a second side 126b (shown in FIG. 2), a third side 126c (shown in FIGS. 1 and 2), and a fourth side 126d (shown in FIG. 2)) extending from the active surface 122 to the opposing back surface 124. The first microelectronic device 110 and the second microelectronic device 120 may be attached by their respective back surfaces (i.e. elements 114 and 124) to a carrier 130, such that they are in close proximity to one another. In one embodiment (shown), the first microelectronic device 110 may contact the second microelectronic first device 120.

The first microelectronic device 110 and the second microelectronic device 120 may each include a plurality of connection structures (elements 118 for the first microelectronic device 110 and elements 128 for the second microelectronic device 120), such as copper bumps, solder bumps, bond pads, and the like, that may formed in or on the first microelectronic device active surface 112 and the second microelectronic device active surface 122, respectively. As will be understood to those skilled in the art, the first microelectronic device connection structures 118 may be electrically connected to integrated circuitry (not shown) within the first microelectronic device 110 and the second microelectronic device connection structures 128 may be electrically connected to integrated circuitry (not shown) within the second microelectronic device 120.

The first microelectronic device 110 and the second microelectronic device 120 may be any appropriate microelectronic die, including, but not limited to a microprocessor, a chipset, a graphics device, a wireless device, a memory device, an application specific integrated circuit device, and the like, or may be any appropriate package, including at least one microelectronic die. The carrier 130 may be any appropriate, substantially rigid, substrate, including, but not limited to a bismaleimide triazine resin substrate, FR4 substrate, polyimide material substrate, and the like. The processes and materials used in the fabrication of the carrier 130 will be understood to those skilled in the art.

Figure 2:
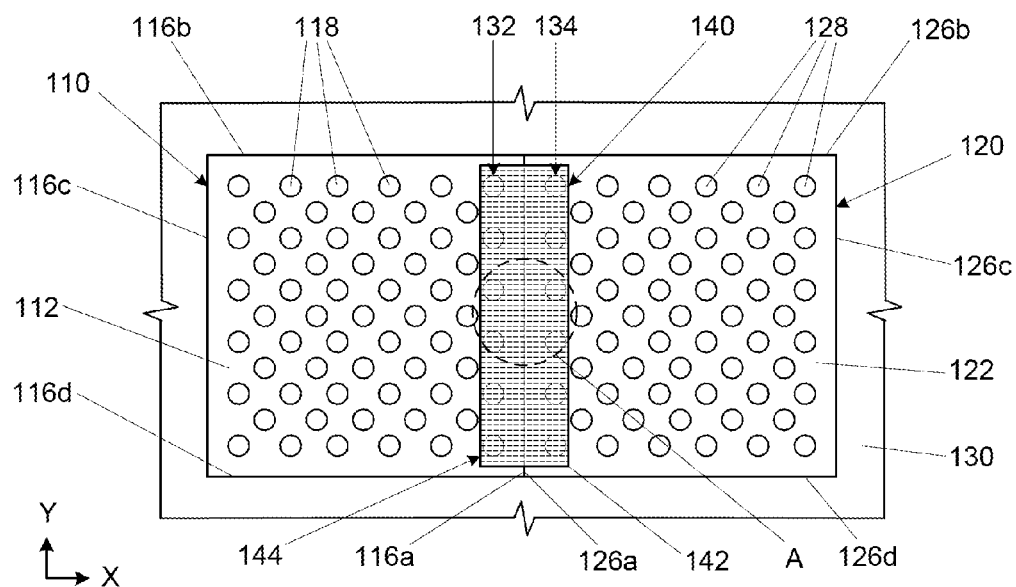
FIG. 2 illustrates a top plan view along lines 2-2 of FIG. 1, according to an embodiment of the present description.

As further shown in FIGS. 1 and 2, at least one row 132 of the first microelectronic device connection structures 118 adjacent at least one first microelectronic device side (illustrated as element 116a) and nearest the second microelectronic device 120 corresponds to at least one row 134 of the second microelectronic device connection structures 128 adjacent at least one second microelectronic device side (illustrated as element 126a) and nearest the first microelectronic device 110. In specific, each first microelectronic device connection structure 118 in at least one first microelectronic device connection structure row 132 corresponds to and may be aligned with a second microelectronic device connection structure 128 in at least one first microelectronic device connection structure row 134 in an x-direction to which it will be connected.

As shown in FIGS. 1 and 2, an interconnect 140 may be attached to the first microelectronic device connection structures 118 in at least one first microelectronic device connection structure row 132 and the second microelectronic device connection structures 128 in at least one second microelectronic device connection structure row 134. The interconnect 140 may comprise an interconnect substrate 142 having a plurality of electrically isolated conductive traces 144 (shown in dashed lines extending in the x-direction in FIG. 2) on a first surface 146 of the interconnect substrate 142. Thus, at least one of the interconnect conductive traces 144 may make an electrical connection between each of the first microelectronic device connection structures 118 in at least one first microelectronic device connection structure row 132 and its corresponding second microelectronic device connection structure 128 in at least one second microelectronic device connection structure row 134.

Figure 3:
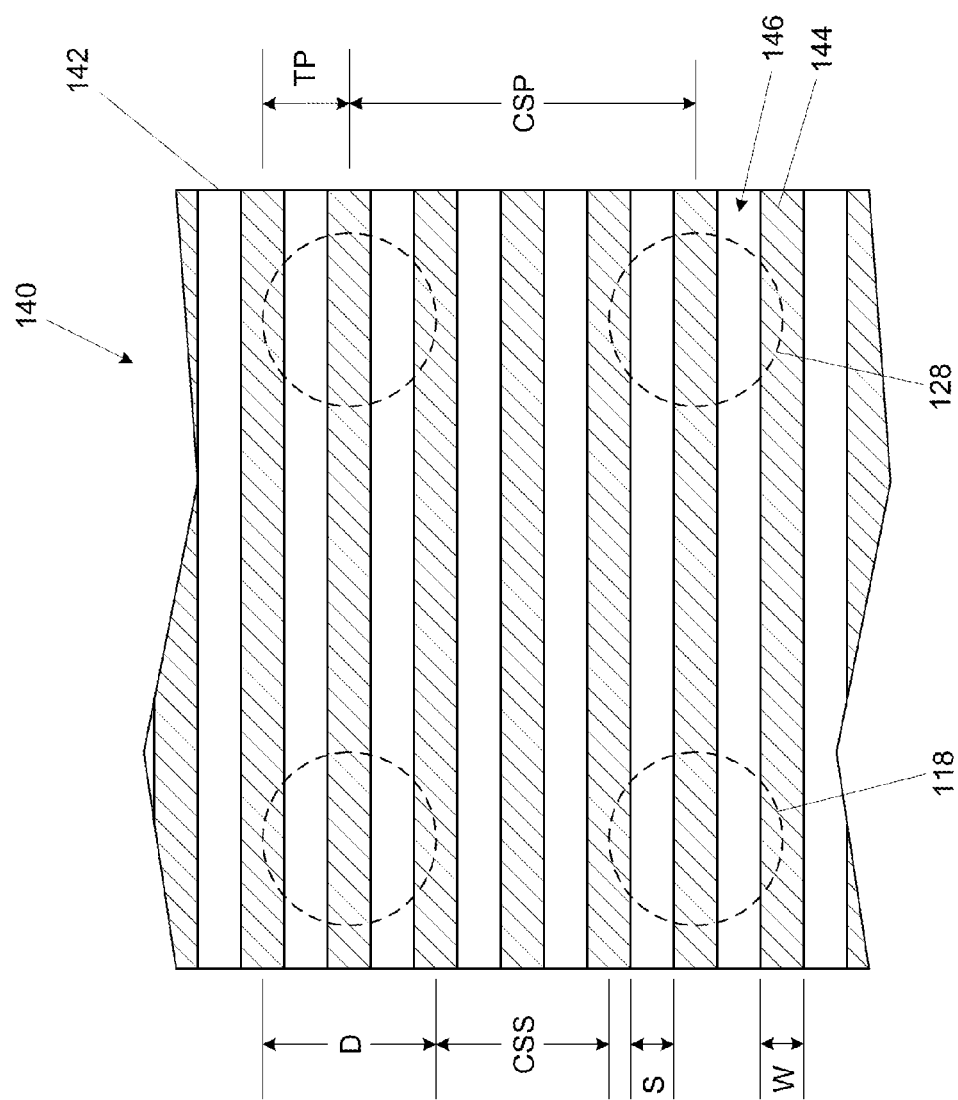
FIG. 3 illustrates a close-up of inset A of FIG. 2 viewed along line 3-3 of FIG. 1, according to an embodiment of the present description.

FIG. 3 illustrates a closer view of the interconnect 140 as insert A of FIG. 2 as view along line 3-3 for FIG. 1 with the first microelectronic device connection structures 118 and the second microelectronic device connection structures 128 shown in shadow for clarity. As previously mentioned, the interconnect 140 may comprise the interconnect substrate 142 having the plurality of electrically isolated interconnect conductive traces 144 formed on or in the interconnect substrate first surface 142. An interconnect conductive trace pitch TP (center-to-center) between adjacent interconnect conductive traces 144 may be considerably smaller than an connection structure pitch CSP between adjacent first microelectronic device connection structures 118 and between adjacent second microelectronic device connection structures 128. Thus, multiple interconnect conductive traces 144 may connect paired first microelectronic device connection structures 118 and second microelectronic device connection structures 128, which may provide redundancy and high current. Furthermore, a smaller interconnect conductive trace pitch TP may reduce the chances of bridging/shorting between adjacent first microelectronic device connection structures 118 and between adjacent second microelectronic device connection structures 128, as will be understood to those skilled in the art.

The interconnect substrate 142 may be any appropriate material, including, but not limited to, silicon, glass, and organic substrates. In one embodiment, the interconnect 140 may be flexible, which may compensate for planarity differences between the first microelectronic device 110 and the second microelectronic device 120 (e.g. wherein the first microelectronic device active surface 112 is not planar to the second microelectronic device active surface 122. As will be understood to those skilled in the art, flexibility of the interconnect 140 may be achieved by using an inherently flexible material for the interconnect substrate 142, by using a thin interconnect substrate 142, or by thinning the interconnection substrate 142 after the formation of the interconnect 140 by any technique known in the art.

The interconnect conductive traces 144 may be made of any appropriate conductive material, including, but not limited to copper, aluminum, gold, silver, and the like. The interconnect conductive traces 144 may be electrically isolated from one another by having an effective space (element S) or by providing a dielectric material (not shown) between adjacent interconnect conductive traces 144. The interconnect conductive traces 144 may be made by any appropriate technique known in the art, including, but not limited to lithography techniques. With the use of lithography techniques, a width (element W) of the interconnect conductive traces 144 and the interconnect conductive trace pitch TP can be 0.5 μm or lower. It is understood that the interconnect conductive traces 144 can be made narrower (i.e. smaller conductive trace width W) to achieve a smaller interconnect conductive trace pitch TP depending on the current requirement of the first microelectronic device 110 and the second microelectronic device 120. As will be understood to those skilled in the art, to achieve a high density of interconnect conductive traces 144, it is preferable to not route power signals through the interconnect 140.

The interconnect conductive traces 144 may be attached to their respective microelectronic device connection structures (e.g. elements 118 and 128) by any appropriate manner known in the art. In one embodiment, the interconnect conductive traces 144 may attached by thermal compression bonding using solder, as will be understood to those skilled in the art. With thermal compression bonding, the bonding nozzle should to apply uniform pressure across the interconnect 140. Depending on choice of materials for the surface finish of the interconnect traces and the microelectronic device connection structures, direct thermal compression bonding without solder may be feasible, which may reduce the risk of bridging between adjacent microelectronic device connection structures (e.g. elements 118 and 128), as will be understood to those skilled in the art.

In another embodiment, a mass reflow technique may also be used to bond the interconnect conductive traces 144 to the microelectronic device connection structures (e.g. elements 118 and 128), wherein surface tension forces from the solder may help conform the interconnect 140 to the first microelectronic device 110 and the second microelectronic device 120. In a further embodiment, anisotropic materials, such as an anisotropic conductive films or pastes, may be applied, such as with a bond head (not shown) to the interconnect 140. Such anisotropic materials may alleviate alignment issues, as they can be used to cover the entire interconnect substrate first surface 146 and interconnect conductive traces 144, but will only be conductive in the z-direction (i.e. between the interconnect conductive traces 144 and their respective microelectronic device connection structures (e.g. elements 118 and 128)). As will be understood to those skilled in the art, an anisotropic material may be most effective for low current transmission or where increased resistance can be tolerated, as anisotropic material may have a higher contact resistance than solder.

Figure 4:
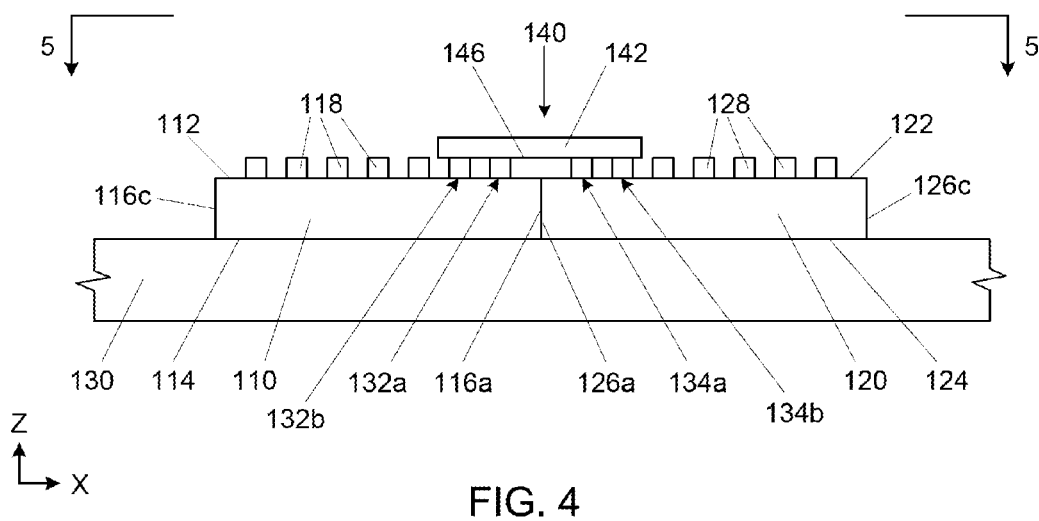
FIG. 4 illustrates a side cross-sectional view of a first microelectronic device and a second microelectronic device connected by multiple rows of connection structures with an interconnect, according to another embodiment of the present description.
Figure 5:
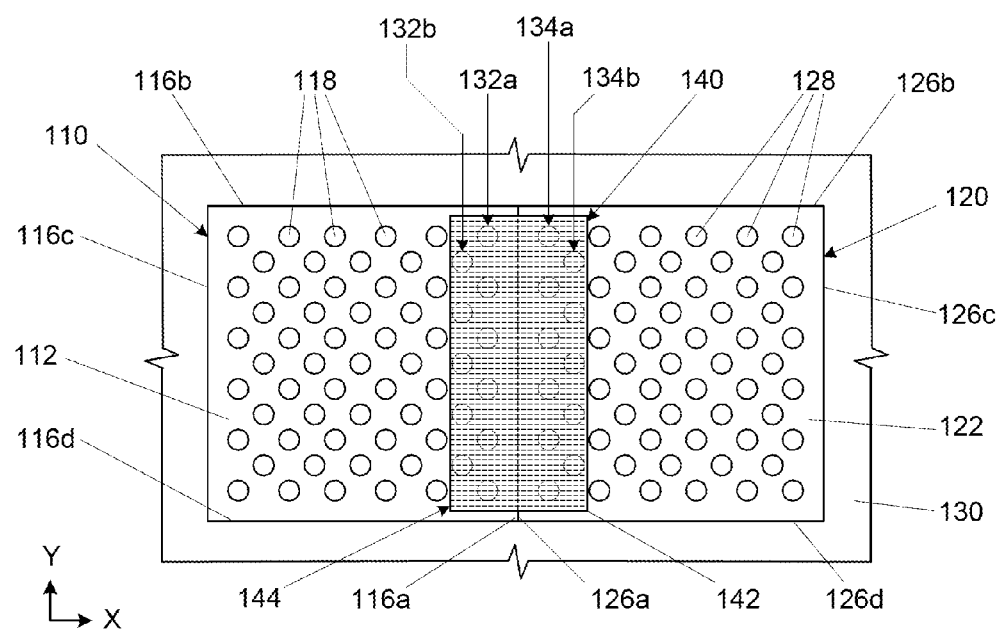
FIG. 5 illustrates a top plan view along lines 5-5 of FIG. 4, according to another embodiment of the present description.

It is understood that the subject matter of the present description is not limited to the connection of a single row of each microelectronic device, such as the first microelectronic device connection structure row 132 and the second microelectronic device connection structure row 134 of FIGS. 1 and 2, but may include multiple rows per microelectronic device. As shown in FIGS. 4 and 5, multiple rows may be interconnected with the interconnect 140. As shown, two rows (first row 132a and second row 132b) of the first microelectronic device 110 may be connected with two rows (e.g. first row 134a and second row 134b) of the second microelectronic device 120. As will be understood, the first microelectronic device first row 132a may be staggered with regard to the first microelectronic device second row 132b and the second microelectronic device first row 134a may be staggered with regard to the second microelectronic device second row 134b, such that there is space to make appropriate connections without shorting. Although FIGS. 4 and 5 illustrate the microelectronic device connection structure first rows 132a and 134a connected to one another and the microelectronic device connection structure second rows 132b and 134b connected to one another, it is understood that with appropriate staggering and alignment the first microelectronic device first row 132a could be connected to the second microelectronic device second row 134b and the first microelectronic device second row 132b could be connected to the second microelectronic device first row 134a.

Figure 6:
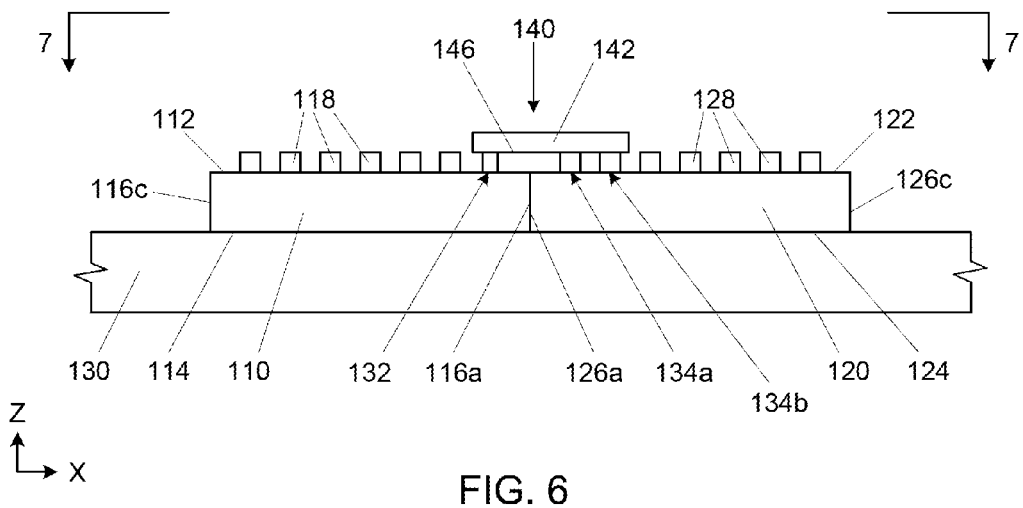
FIG. 6 illustrates a side cross-sectional view of a first microelectronic device and a second microelectronic device connected by multiple rows of connection structures with an interconnect, according to still another embodiment of the present description.
Figure 7:
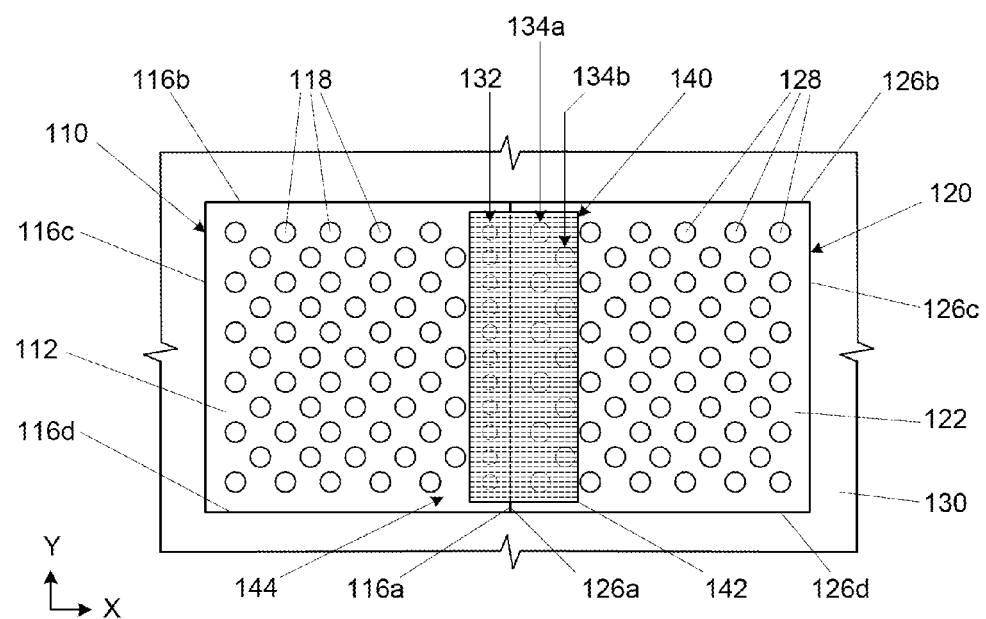
FIG. 7 illustrates a top plan view along lines 7-7 of FIG. 6, according to another embodiment of the present description.

It is further understood that the subject matter of the present description may have a variety of configurations. For one example, as shown in FIGS. 6 and 7, a single row of one of the microelectronic devices, such as the first microelectronic device connection structure row 132 of FIGS. 1 and 2 may be connected multiple rows of the other microelectronic device, such as the second microelectronic device connection structure row 134a and 134b of FIGS. 4 and 5. As shown in FIGS. 6 and 7, multiple rows may be interconnected with the interconnect 140. As will be understood, the first microelectronic device first row 132 may have a greater number of connection structures 118 having a smaller diameter D (see FIG. 3) and having a narrower pitch P (see FIG. 3) than the remaining connection structures 118 on the first microelectronic device 110, and the second microelectronic device first row 134a may be staggered with regard to the second microelectronic device second row 134b, such that there is space to make appropriate connections without shorting. It is understood that any appropriate microelectronic device connection structure sizing, pitch, and arrangement may be employed with regard to the microelectronic devices.

As will be understood to those skilled in the art, the embodiments of the present description may enable high precision, high density interconnection between microelectronic devices. For example and not by way of limitation, if it is assumed that the interconnect conductive trace width W is about 2 μm and an interconnect conductive trace spacing S is about 2 μm, a spacing CSS between the adjacent microelectronic device connection structures (e.g. elements 118 and 128)) would need to be at least about 6 μm. If the placement accuracy of 5 μm, such as from a thermocompression bonding tool, is factored in, the microelectronic device connection structure spacing CSS requirement becomes about 11 μm. When a flexible interconnect 140 is utilized, stresses may be minimized such that the microelectronic device connection structures (e.g. elements 118 and 128) can be as small as possible without introducing stresses in any subsequently disposed interlayer dielectrics, as will be understood to those skilled in the art. With the microelectronic device connection structures (e.g. elements 118 and 128) having a diameter D of about 10 μm, the resulting connection structure pitch CSP of the adjacent microelectronic device connection structures (e.g. elements 118 and 128) would be about 21 μm, and would result in about forty-seven (47) interconnect conductive traces 144 per millimeter. For a two row arrangement, such as illustrated in FIGS. 4 and 5, the equivalent to one interconnect trace pitch TP spacing may need to be added so that at least one interconnect conductive trace 144 will escape between first row of pads (such as microelectronic device connection structure first rows 132*a* and 134*a*) to reach the microelectronic device connection structure second rows 132*b* and 134*b*. This will result in the connection structure pitch CSP of about 25 μm which is about eighty (80) interconnect conductive traces 144 per millimeter. The small interconnect conductive trace width W may result in high number of interconnect conductive traces 144, which can be made at low cost. As will be understood, the embodiments of the description may facilitate highly multi-functional integration of microelectronic devices on the same microelectronic package having interconnect conductive trace 144 densities of greater than fifty (50) per millimeter that may result in relatively high performance for the microelectronic package. Furthermore, embodiments of the present description may allow for a large microelectronic device to be replaced with smaller microelectronic devices with high interconnect trace density connections therebetween to achieve similar performance, which may significantly improve microelectronic device yield.

Figure 8:
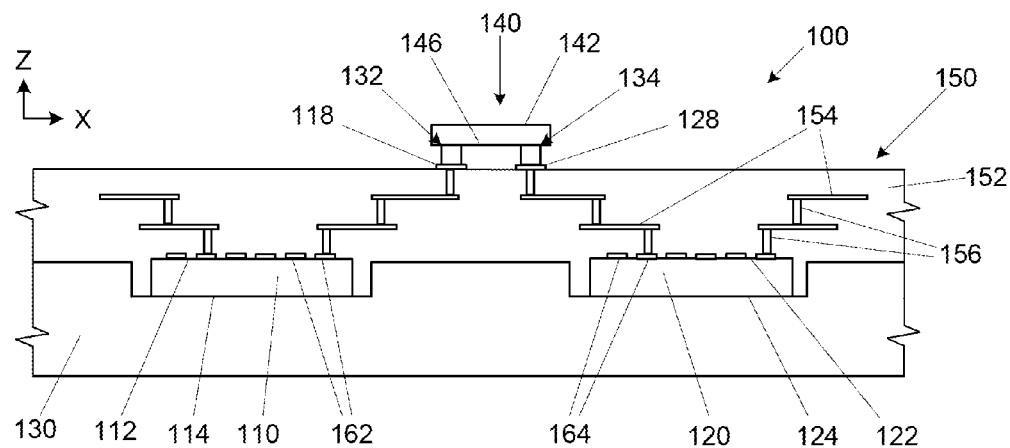
FIG. 8 illustrates a side cross-sectional view of a first microelectronic device and a second microelectronic device connected with an interconnect disposed on a connection trace network, according to another embodiment of the present description.
Figure 9:
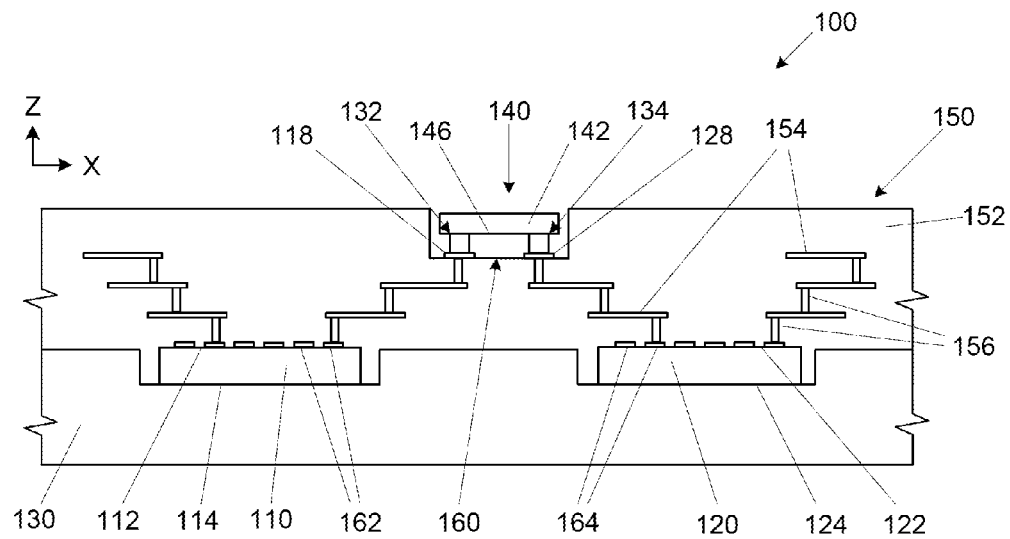
FIG. 9 illustrates a side cross-sectional view of a first microelectronic device and a second microelectronic device connected with an interconnect within a cavity in the connection trace network, according to still another embodiment of the present description.

Embodiments of the present description are not limited to the first microelectronic device interconnect structures 118 being immediately adjacent the first microelectronic device 110 and the second microelectronic device interconnect structures 128 being immediately adjacent the second microelectronic device 120. Rather, as shown in FIGS. 8 and 9, the first microelectronic interconnect structures 118 and the second microelectronic device interconnect structures 128 may be formed in or on a connection trace network 150 to form rows 132 and 134 (see also FIG. 2), wherein the connection trace network 150 may abut the first microelectronic device 110 and the second microelectronic device 120 and wherein the interconnect 140 connects the first microelectronic device interconnect structures 118 to the second microelectronic device interconnect structures 128, such as has been discussed. The connection trace network 150, may comprise multiple layers of dielectric material 152 (for the sake of conciseness and clarity, separate dielectric material layers are not shown) conductive traces 154, and conductive vias 156 through the dielectric material 152, which may connect the first microelectronic device interconnect structures 118 to bond pads 162 formed in or on the first microelectronic device active surface 112 and which may connect the second microelectronic device interconnect structures 128 to bond pads 164 formed in or on the second microelectronic device active surface 112. If the Z-height of the microelectronic package 100 illustrated in FIG. 8 is a concern, a cavity 160 can be formed in the connection trace network 150, wherein the first microelectronic interconnect structures 118 and the second microelectronic device interconnect structures 128 may be formed within the connection trace network cavity 160 and the interconnect 140 may be placed within the conductive trace network cavity 160 to attach the first microelectronic interconnect structures 118 and the second microelectronic device interconnect structures 128, as shown in FIG. 9. The processes and materials used in the fabrication of connection trace networks 150 are well known in the art and for the sake of conciseness and clarity will not be discussed herein.

One application of the embodiments shown in FIGS. 8 and 9 may relate to bumpless build-up layer (BBUL) packages. As will be understood to those skilled in the art, BBUL packages may be limited to use of relatively small microelectronic devices due to manufacturing constraints. Thus, by partitioning a single, relatively large microelectronic device into two or more smaller microelectronic devices (e.g. elements 110 and 120) and connected them together with an interconnect 140, a BBUL package can be formed having the functionality of the single, large microelectronic device.

Figure 10:
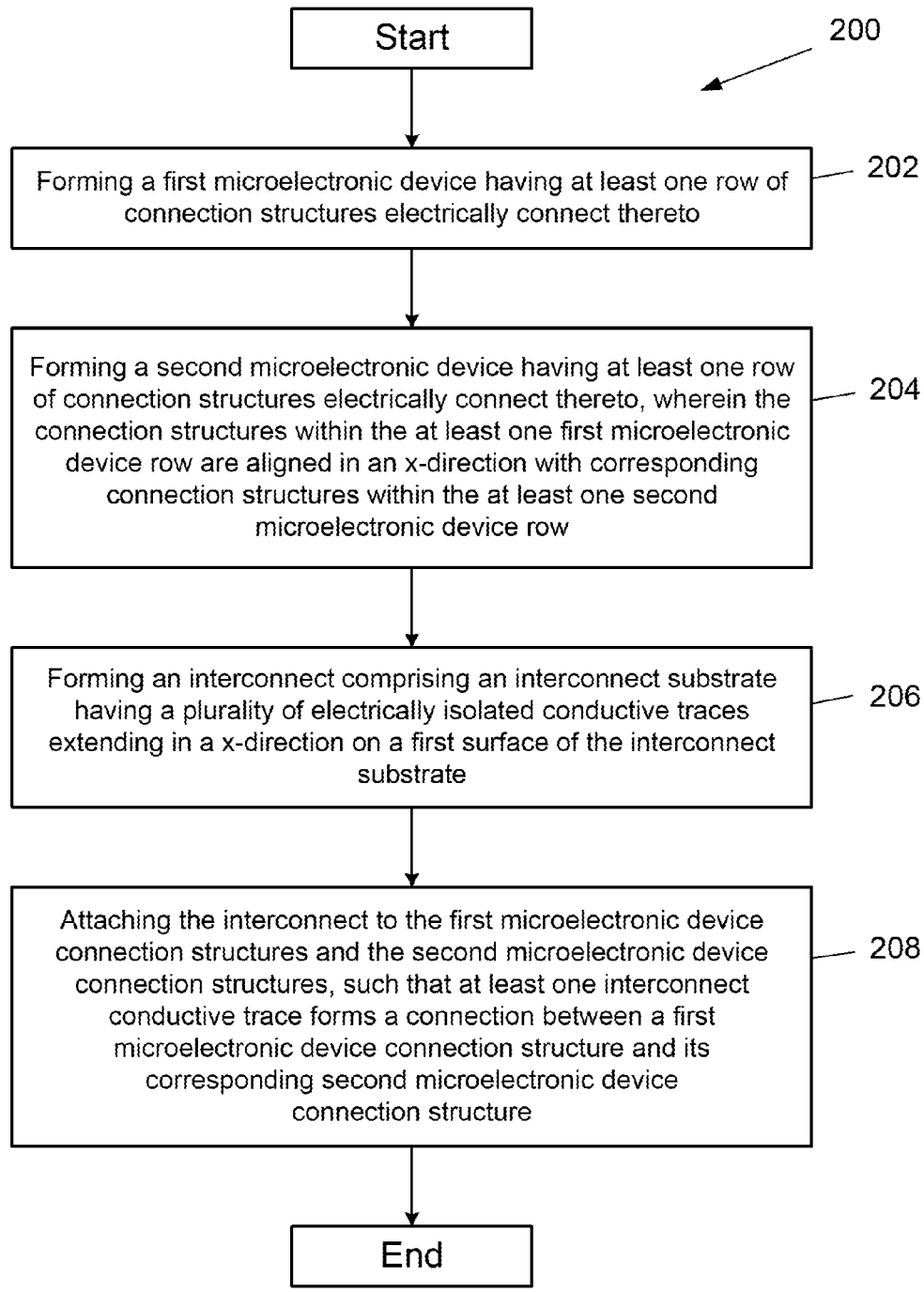
FIG. 10 is a flow chart of a process of fabricating a microelectronic package, according to an embodiment of the present description.

FIG. 10 is a flow chart of a process 200 of fabricating a microelectronic package according to an embodiment of the present description. As set forth in block 202, a first microelectronic device may be formed having at least one row of connection structures electrically connected thereto. A second microelectronic device may be formed having at least one row of connection structures electrically connected thereto, wherein the connection structures within the at least one first microelectronic device row are aligned in an x-direction with corresponding connection structures within the at least one second microelectronic device row, as set forth in block 204. As set forth in block 206, an interconnect may be formed comprising an interconnect substrate having a plurality of electrically isolated conductive traces extending in the x-direction on a first surface of the interconnect substrate. The interconnect may be attached to the first microelectronic device connection structures and the second microelectronic device connection structures, such that at least one interconnect conductive trace forms a connection between a first microelectronic device connection structure and its corresponding second microelectronic device connection structure, as set forth in block 208.

Figure 11:
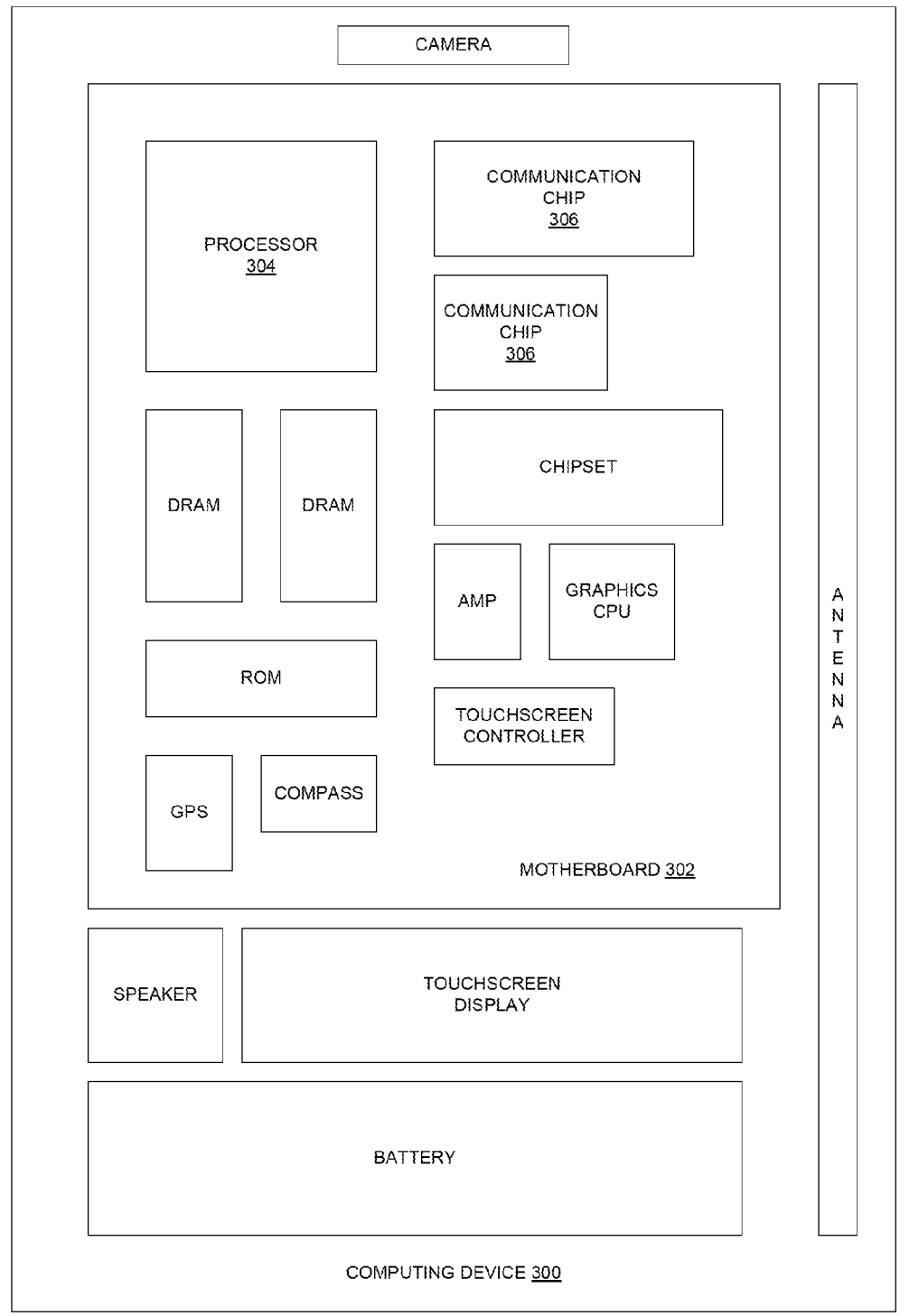
FIG. 11 illustrates a computing device in accordance with one implementation of the present description.

FIG. 11 illustrates a computing device 300 in accordance with one implementation of the present description. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor may be connected to other devices with an interconnect in accordance with implementations of the present description. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the present description, the integrated circuit die of the communication chip may be connected to other devices with an interconnect in accordance with embodiments of the present description.

In further implementations, another component housed within the computing device 300 may contain an integrated circuit die that includes an interconnect in accordance with embodiments of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-11. The subject matter may be applied to other microelectronic devices and assembly applications, as well as any appropriate electronic application, as will be understood to those skilled in the art.

The following examples pertain to further embodiments, wherein Example 1 is a microelectronic package comprising a first microelectronic device having at least one row of connection structures electrically connected thereto, a second microelectronic device having at least one row of connection structures electrically connected thereto, wherein at least one of the connection structures within the at least one first microelectronic device row is aligned with a corresponding connection structure within the at least one second microelectronic device row in an x-direction, and an interconnect comprising an interconnect substrate having a plurality of electrically isolated conductive traces extending in the x-direction on a first surface of the interconnect substrate, wherein the interconnect is attached to the at least one first microelectronic device connection structure row and at least one second microelectronic device connection structure row, such that at least one interconnect conductive trace forms a connection between a first microelectronic device connection structure and its corresponding second microelectronic device connection structure.

In Example 2, the subject matter of Example 1 can optionally include the first microelectronic device connection structures formed adjacent an active surface of the microelectronic device and the second microelectronic device connection structures formed adjacent an active surface of the second microelectronic device.

In Example 3, the subject matter of Example 1 can optionally include a connection trace network adjacent the first microelectronic device and the second microelectronic device, and wherein the first microelectronic device row of connection structures and the second microelectronic device row of connection structures are formed in or on the connection trace network.

In Example 4, the subject matter of Example 3 can optionally include a cavity within the connection trace network, wherein the first microelectronic device row of connection structures and the second microelectronic device row of connection structures are formed within the connection trace network cavity.

In Example 5, the subject matter of any of Examples 1 to 4 can optionally include a carrier, wherein a back surface of the first microelectronic device and a back surface of the second microelectronic device are attached to the carrier.

In Example 6, the subject matter of any of Examples 1 to 5 can optionally include one side of the first microelectronic device abutting one side of the second microelectronic device.

In Example 7, the subject matter of any of Examples 1 to 6 can optionally include the first microelectronic device having at least a first row and a second row of connection structures electrically connected thereto, the second microelectronic device having at least a first row and a second row of connection structures electrically connected thereto, and wherein at least one interconnect conductive trace forms a connection between one first microelectronic device connection structure in the first microelectronic device first row and at least one connection structure in at least one of the first row and the second row of the second microelectronic device and wherein at least one interconnect conductive trace forms a connection between one second microelectronic device connection structure in the second microelectronic device first row and at least one connection structure in at least one of the first row and the second row of the first microelectronic device.

The following examples pertain to further embodiments, wherein Example 8 is a method of fabricating a microelectronic package comprising: forming a first microelectronic device having at least one row of connection structures electrically connected thereto; forming a second microelectronic device having at least one row of connection structures electrically connected thereto; aligning at least one connection structure within the at least one first microelectronic device row with at least one corresponding connection structure within the at least one second microelectronic device row in an x-direction; forming an interconnect comprising an interconnect substrate having a plurality of electrically isolated conductive traces extending in the x-direction on a first surface of the interconnect substrate; and attaching the interconnect to the first microelectronic device connection structures and the second microelectronic device connection structures, such that at least one interconnect conductive trace forms a connection between a first microelectronic device connection structure and its corresponding second microelectronic device connection structure.

In Example 9, the subject matter of Example 8 can optionally include forming a first microelectronic device having at least one row of connection structures formed in or on an active surface thereof and forming a first microelectronic device having at least one row of connection structures formed in or on an active surface thereof.

In Example 10, the subject matter of Example 8 can optionally include forming a connection trace network adjacent the first microelectronic device and the second microelectronic device, and wherein the first microelectronic device row of connection structures and the second microelectronic device row of connection structures are formed in or on the connection trace network.

In Example 11, the subject matter of Example 10 can optionally include forming a cavity within the connection trace network, wherein the first microelectronic device row of connection structures and the second microelectronic device row of connection structures are formed within the connection trace network cavity.

In Example 12, the subject matter of any of Examples 8 to 11 can optionally include attaching a back surface of the first microelectronic device and a back surface of the second microelectronic device to a carrier.

In Example 13, the subject matter of any of Examples 8 to 12 can optionally include abutting one side of the first microelectronic device to one side of the second microelectronic device.

In Example 14, the subject matter of any of Examples 8 to 13 can optionally include thermocompression bonding the interconnect to the first microelectronic device connection structures and the second microelectronic device connection structures.

In Example 15, the subject matter of any of Examples 8 to 14 can optionally include mass reflow bonding the interconnect to the first microelectronic device connection structures and the second microelectronic device connection structures.

In Example 16, the subject matter of any of Examples 8 to 15 can optionally include attaching the interconnect to the first microelectronic device connection structures and the second microelectronic device connection structures with an anisotropic material.

In Example 17, the subject matter of any of Examples 8 to 16 can optionally include forming a first microelectronic device having at least a first row and a second row of connection structures, forming a second microelectronic device having at least a first row and a second row of connection structures, wherein at least one interconnect conductive trace forms a connection between one first microelectronic device connection structure in the first microelectronic device first row and at least one connection structure in at least one of the first row and the second row of the second microelectronic device and wherein at least one interconnect conductive trace forms a connection between one second microelectronic device connection structure in the second microelectronic device first row and at least one connection structure in at least one of the first row and the second row of the first microelectronic device.

The following examples pertain to further embodiments, wherein Example 18 is a computing device, comprising: a board; and at least one of a processor and a communication chip electrically coupled to the board wherein the at least one of a processor and a communication chip comprises a microelectronic package including: a first microelectronic device having at least one row of connection structures electrically connected thereto; a second microelectronic device having at least one row of connection structures electrically connected thereto, wherein at least one connection structure within the at least one first microelectronic device row is aligned with a corresponding connection structure within the at least one second microelectronic device row in an x-direction; and an interconnect comprising an interconnect substrate having a plurality of electrically isolated conductive traces extending in the x-direction on a first surface of the interconnect substrate, wherein the interconnect is attached to the first microelectronic device connection structures and the second microelectronic device connection structures, such that at least one interconnect conductive trace forms a connection between a first microelectronic device connection structure and its corresponding second microelectronic device connection structure.

In Example 19, the subject matter of Example 18 can optionally include the first microelectronic device connection structures formed adjacent an active surface of the microelectronic device and wherein the second microelectronic device connection structures formed adjacent an active surface of the second microelectronic device.

In Example 20, the subject matter of Example 18 can optionally include a connection trace network adjacent the first microelectronic device and the second microelectronic device, and wherein the first microelectronic device row of connection structures and the second microelectronic device row of connection structures are formed in or on the connection trace network.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package comprising:
a first microelectronic device having at least one row of connection structures electrically connected thereto;
a second microelectronic device having at least one row of connection structures electrically connected thereto, wherein at least one connection structures within the at least one first microelectronic device row is aligned with corresponding connection structures within the at least one second microelectronic device row in an x-direction; and
an interconnect comprising an interconnect substrate having a plurality of electrically isolated conductive traces extending in the x-direction on a first surface of the interconnect substrate, wherein the interconnect is attached to the at least one first microelectronic device connection structure row and at least one second microelectronic device connection structure row, such that at least one interconnect conductive trace forms a connection between a first microelectronic device connection structure and its corresponding second microelectronic device connection structure;
wherein the first microelectronic device has at least a first row and a second row of connection structures electrically connected thereto, wherein the second microelectronic device has at least a first row and a second row of connection structures electrically connected thereto, and wherein at least one interconnect conductive trace forms a connection between one first microelectronic device connection structure in the first microelectronic device first row and at least one connection structure in at least one of the first row and the second row of the second microelectronic device and wherein at least one interconnect conductive trace forms a connection between one second microelectronic device connection structure in the second microelectronic device first row and at least one connection structure in at least one of the first row and the second row of the first microelectronic device.

2. The microelectronic package of claim 1 wherein the first microelectronic device connection structures are formed adjacent an active surface of the microelectronic device and wherein the second microelectronic device connection structures are formed adjacent an active surface of the second microelectronic device.

3. The microelectronic package of claim 1, further comprising a connection trace network adjacent the first microelectronic device and the second microelectronic device, and wherein the first microelectronic device row of connection structures and the second microelectronic device row of connection structures are formed in or on the connection trace network.

4. The microelectronic package of claim 3, further comprising a cavity within the connection trace network, wherein the first microelectronic device row of connection structures and the second microelectronic device row of connection structures are formed within the connection trace network cavity.

5. The microelectronic package of claim 1, further comprising a carrier, wherein a back surface of the first microelectronic device and a back surface of the second microelectronic device are attached to the carrier.

6. The microelectronic package of claim 1, further comprising one side of the first microelectronic device abutting one side of the second microelectronic device.

7. A computing device, comprising:
a board; and
at least one of a processor and a communication chip electrically coupled to the board wherein the at least one of a processor and a communication chip comprises a microelectronic package including:
 a first microelectronic device having at least one row of connection structures electrically connected thereto;
 a second microelectronic device having at least one row of connection structures electrically connected thereto, wherein at least one connection structures within the at least one first microelectronic device row is aligned with a corresponding connection structure within the at least one second microelectronic device row in an x-direction; and
 an interconnect comprising an interconnect substrate having a plurality of electrically isolated conductive traces extending in the x-direction on a first surface of the interconnect substrate, wherein the interconnect is attached to the at least one first microelectronic device connection structure row and the at least one second microelectronic device connection structure row, such that at least one interconnect conductive trace forms a connection between a first microelectronic device connection structure and its corresponding second microelectronic device connection structure;
 wherein the first microelectronic device has at least a first row and a second row of connection structures electrically connected thereto, wherein the second microelectronic device has at least a first row and a second row of connection structures electrically connected thereto, and wherein at least one interconnect conductive trace forms a connection between one first microelectronic device connection structure in the first microelectronic device first row and at least one connection structure in at least one of the first row and the second row of the second microelectronic device and wherein at least one interconnect conductive trace forms a connection between one second microelectronic device connection structure in the second microelectronic device first row and at least one connection structure in at least one of the first row and the second row of the first microelectronic device.

8. The computing device of claim 7 wherein the first microelectronic device connection structures are formed adjacent an active surface of the microelectronic device and wherein the second microelectronic device connection structures are formed adjacent an active surface of the second microelectronic device.

9. The computing device of claim 7, further comprising a connection trace network adjacent the first microelectronic device and the second microelectronic device, and wherein the first microelectronic device row of connection structures and the second microelectronic device row of connection structures are formed in or on the connection trace network.

10. The computing device of claim 9, further comprising a cavity within the connection trace network, wherein the first microelectronic device row of connection structures and the second microelectronic device row of connection structures are formed within the connection trace network cavity.

11. The computing device of claim 7, further comprising a carrier, wherein a back surface of the first microelectronic device and a back surface of the second microelectronic device are attached to the carrier.

12. The computing device of claim 7, further comprising one side of the first microelectronic device abutting one side of the second microelectronic device.

* * * * *